United States Patent [19]

Frederickson et al.

[11] Patent Number: 4,917,547
[45] Date of Patent: Apr. 17, 1990

[54] APPARATUS AND METHOD FOR DISPENSING SOLUTION TO PREVENT SMEAR IN THE MANUFACTURE OF PRINTED CIRCUIT BOARDS

[76] Inventors: Jeffrey W. Frederickson, 2107 SW. Edgewood Rd., Portland, Oreg. 97201; Douglas R. Kocher, 10961 SE. Sunnyside, Clackamas, Oreg. 97045

[21] Appl. No.: 307,996

[22] Filed: Feb. 9, 1989

[51] Int. Cl.⁴ ............................................. B23Q 11/12
[52] U.S. Cl. ............................... 408/1 R; 29/DIG. 88; 408/61; 408/98; 409/132; 409/136
[58] Field of Search ............... 409/136, 137, 134, 132; 408/68, 98, 1 R, 8, 61; 29/DIG. 84, DIG. 88

[56] References Cited

U.S. PATENT DOCUMENTS 4,037,982  7/1977  Clement ........................ 409/137 X
4,708,539  11/1987  Threadgill ..................... 409/136 X

*Primary Examiner*—Z. R. Bilinsky
*Attorney, Agent, or Firm*—Chernoff, Vilhauer, McClung & Stenzel

[57] ABSTRACT

A method and apparatus for dispensing a smear-preventing solution onto a drill bit used for drilling printed circuit boards includes a drilling jig having a drill bit for engaging the printed circuit board and a dispensing system for dispensing a smear-preventing solution under pressure so that it sprays onto the drill bit through a hole in a pressure foot as the drill bit engages the printed circuit board. A switch mounted on the drilling jig controls the dispensing of the solution so that the solution is dispensed during the time that the drill bit is in the vicinity of the printed circuit board, and is turned off when the drill bit leaves the printed circuit board, or when the drill is turned off. A vacuum hose connected to the housing creates a low pressure condition adjacent the drill bit which provides for coating the drill bit while the solution is being dispensed, and for pulling the excess solution and debris created by the drill bit away from the surface of the printed circuit board.

11 Claims, 2 Drawing Sheets

APPARATUS AND METHOD FOR DISPENSING SOLUTION TO PREVENT SMEAR IN THE MANUFACTURE OF PRINTED CIRCUIT BOARDS

BACKGROUND OF THE INVENTION

The following invention relates to a dispensing apparatus for a solution, and a method of using that solution, for treating printed circuit boards to prevent smear in the manufacture thereof.

During the manufacture of printed circuit boards made of a fiberglass epoxy having top and bottom conducting copper layers sandwiching a dielectric material such as a glass epoxy layer and including conductive layers within the sandwich, holes are drilled which are then electroless copper plated to create circuit paths from one copper layer to the other. When these holes are drilled, a phenomenon known as "smear" may result. Smear is a dielectric material which is deposited on the inner surfaces of the holes made by the drill. The smeared inner walls of the drilled-out holes resist electroless copper deposition and the smeared material may also effectively cover inner copper conductive layer in multi-layer boards creating a void or causing poor adhesion such that no electrical contact is made between the inner walls of the hole and the inner conductive layers.

Smear is an industry-wide problem in the manufacture of printed circuit boards, and many approaches have been suggested as solutions. The most common approach, called "desmear," is to attempt to remove the smear after the holes have been drilled. Smear removal generally takes the form of immersing the boards in a strong sulfuric acid bath to roughen or remove the smear and then subsequently rinsing the boards. This approach is expensive and leads to other problems such as residues left by the sulfuric acid which also interfere with the electroless deposit of copper in the printed circuit board holes. Other approaches use chemicals other than sulfuric acid; nevertheless in these processes, it is necessary to treat the board after the holes have been drilled and then to rinse the treatment chemical away. The rinsing step, in particular, may be extremely time consuming and the equipment needed for post drilling treatment of the boards for any type of smear removal process is very expensive.

The only other known attempts to control smear prior to drilling involve spraying ultracold liquid air or liquid nitrogen on the drill bit prior to drilling, or the immersion of the boards in a water bath during drilling. In both cases the theory is that if the temperature of the drill bit can be kept low enough, smear will not form. Neither of the above approaches are viable because the specific heat of the epoxy is such that it reaches a melting point quickly even though the drill bit is cold.

SUMMARY OF THE INVENTION

The present invention is an apparatus and method for dispensing a solution to prevent smear from forming as the holes are being drilled. According to the invention, as the holes are drilled, a solution is sprayed onto the drill bit which contains at least one active amine which, when heated by the friction of the drill bit going through the board, causes the amine to prevent the mechanical adhesion of smear or prevent its generation. The board is drilled as the solution is applied directly to the drill bit in the form of a spray or jet.

The apparatus includes a conventional drilling jig which includes a drill bit for engaging a printed circuit board. The jig further includes a housing having a pressure foot with an aperture that permits the drill bit to pass through. The pressure foot engages the printed circuit board while the drill is being lowered and also during the time the drill engages the board while the hole is being drilled. A conduit carrying a smear-preventing solution is connected to a bore in the pressure foot. The smear-preventing solution is pumped through the conduit where it emerges as a spray to coat the drill bit as the drill bit passes through the aperture and operationally engages the printed circuit board. A vacuum source connected to the housing pulls the spray across the drill bit, coating it evenly, and removes the excess solution along with the fines and other debris generated by the drilling operation.

The solution used for treating the boards in this way comprises active amines which may include monoethanolamine, fatty acids which preferably include oleic acid, and an agent, which may be an alcohol, to reduce surface tension. An organo phosphate may also be added to provide stabilization and high pressure lubricity. A solution may be prepared comprising approximately 9% active amines, 10% fatty acids, and 0.1% alcohol with the balance of the solution being water and other ingredients, such as lubricants, depending upon the application. The alcohol reduces the surface tension of the solution so that it may easily penetrate the holes as they are being drilled. The oleic acid inhibits the corrosive effect of the monoethanolamine and keeps it from attacking the other portions of the board except in the presence of heat. Due to the high temperatures created by the friction of the drill bit going through the board, the monoethanolamine overcomes the inhibiting effect of the oleic acid and becomes very active, treating the inner walls of the hole as the drill bit goes through. Because the heat is generated locally in the area around the drill, on all other portions of the board the amine remains neutral, inhibited by the oleic acid. Since smear is prevented during the drilling operation, the necessity for expensive post drilling smear removal methods is obviated.

It is a primary object of this invention to provide an apparatus and method of dispensing a chemical solution for the prevention of smear in the drilling of printed circuit boards.

A further object of this invention is to provide a dispensing system which can be used to spray a solution on a drill bit during a drilling operation to actively prevent smear in the region of the hole as it is being drilled without damaging the remainder of the board.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
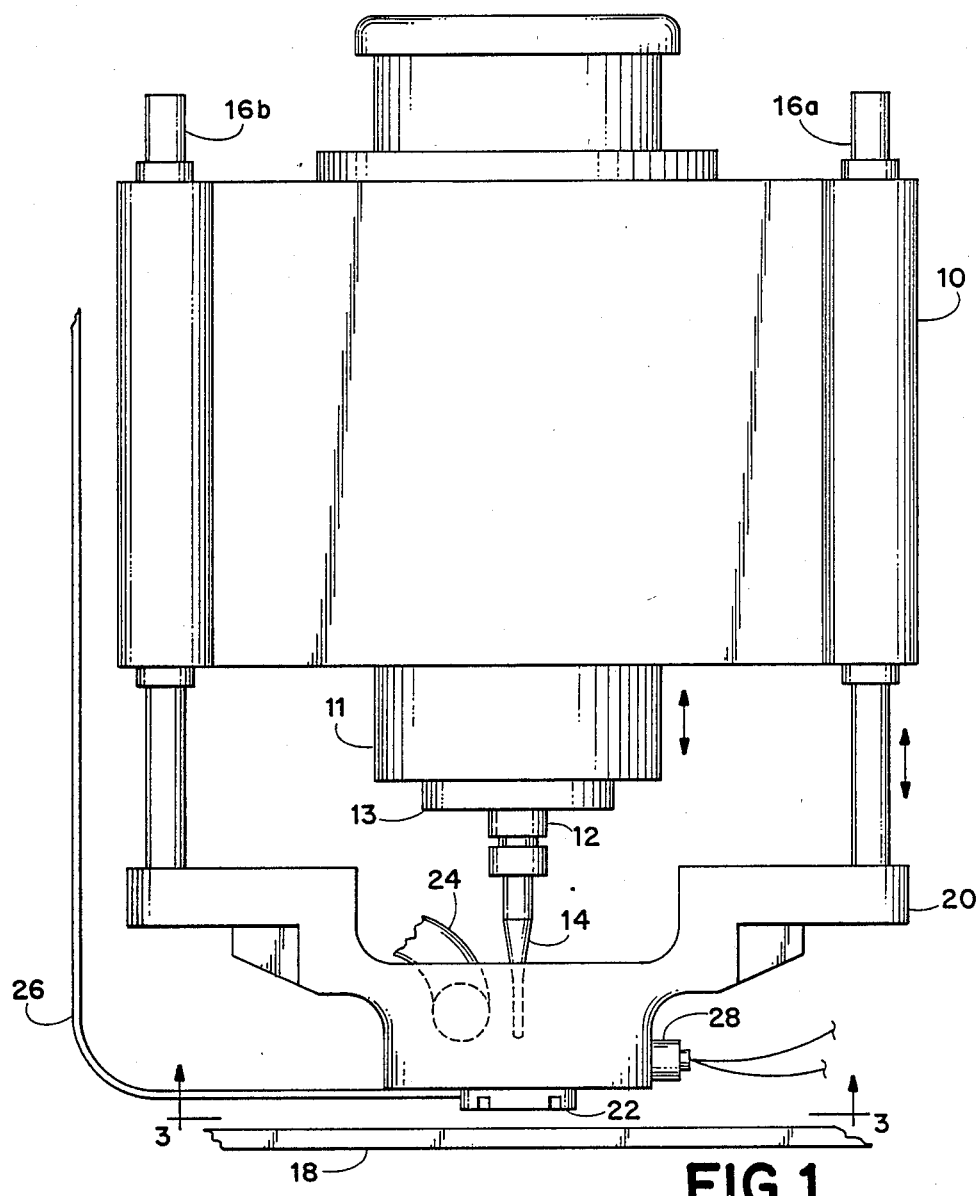
FIG. 1 is a front view of a drilling jig including portions of the solution dispensing apparatus of the present invention.

A drilling jig 10 includes a reciprocally movable (in the direction indicated by the arrows) cylinder 11 carrying a rotary spindle 13 which includes a chuck 12 for holding a drill bit 14. The jig 10 further includes a reciprocally movable pair of cylindrical rods 16a and 16b supporting a housing 20. A reciprocating mechanism (not shown) moves both portions of the jig 10 up and down in the direction of the arrows to drill holes in various parts of a printed circuit board 18 as the board is moved laterally in an X-Y carriage (not shown). The portion including the cylinder 11 moves as indicated by the arrows independently of the portion including the rods 16a and 16b. These are conventional drilling machines, and usually between four to six drilling jigs and associated X-Y carriages may be contained within a single machine, all of which is under computer control. An example of this type of drilling machine is the Dynamotion 2400 series manufactured by Dynamotion Corporation of Santa Ana, Calif.

A housing 20 is coupled to the reciprocating cylinders 16a and 16b. The housing includes a pressure foot 22 which is a small plastic cylindrical member that presses against the printed circuit board 18 as the housing 20 is lowered on cylinders 16a and 16b. Connected to the housing 20 is a vacuum hose 24 which is connected to a vacuum pump (not shown) of conventional design. A conduit 26 which is used for the dispensing of a smear-preventing solution is connected to the pressure foot 22. A switch 28 which may be, for example, a magnetic proximity switch, is affixed to the housing 20 and is triggered by the proximity of the printed circuit board 18 at some predetermined distance between the housing 20 and the printed circuit board 18. The switch 28 may control a pump or valving arrangement (not shown) that turns on or off the flow of solution through te conduit 26.

Figure 2:
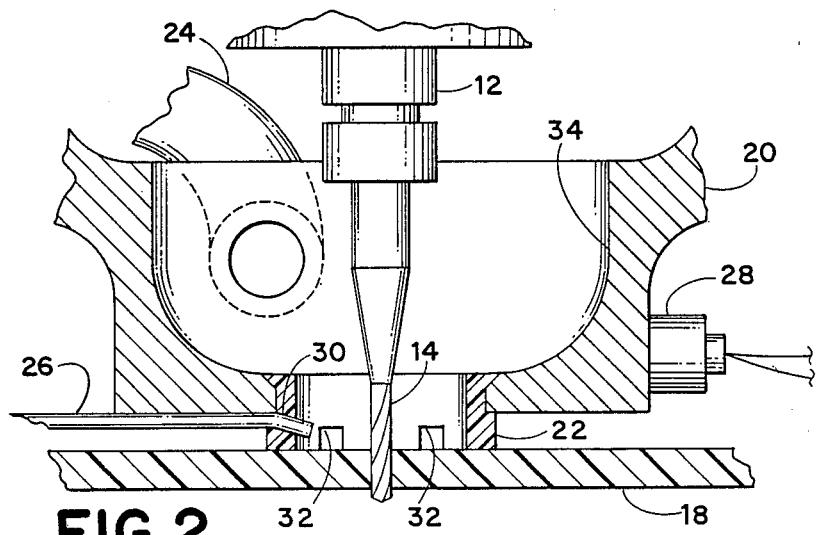
FIG. 2 is a partial cutaway view of the apparatus of FIG. 1.
Figure 3:
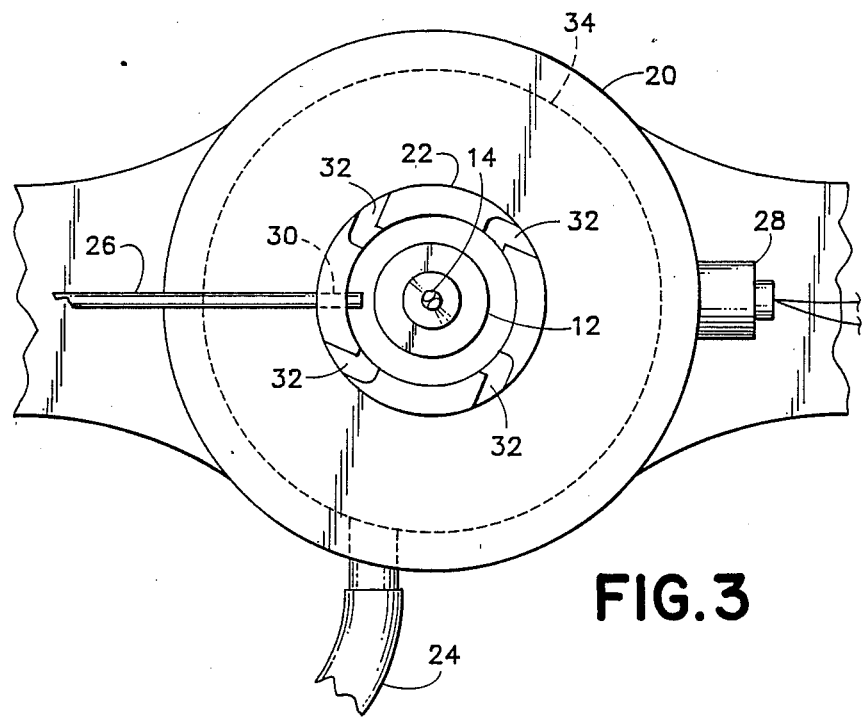
FIG. 3 is a partial bottom view taken along line 3—3 of FIG. 1.

The details of the housing 20 and pressure foot 22 are shown in FIG. 2. The pressure foot 22 is a small plastic cylindrical piece which is press fitted into the bottom of the housing 20. It has a small bore 30 through which the conduit 26 is inserted so that the conduit 26 can apply a spray solution directly to the drill bit 14 as the drill bit engages the printed circuit board 18. The pressure boot 22 includes slotted apertures 32 which allow the vacuum hose 24 to create a low pressure condition adjacent the drill bit 14, so that air which enters through the slotted apertures 32 is drawn upwards through the central cup portion 34 of the housing 20 carrying with it the excess of the solution and the fine particulate matter created by the drill bit 14. As shown in FIG. 3 there are four such slots and they are canted at an angle. If desired, there could be additional slots with 4–8 being the optimum number. The presence of the low pressure condition caused by the vacuum hose in the vicinity around the drill bit causes the spray from the conduit to coat the drill bit 14 as it passes through the pressure foot 22.

The magnetic proximity switch 28 may be of any commercially available type. Examples of switches which are acceptable for this purpose are obtainable from Schonbuch Electronic, Nufringen, West Germany, and are imported into this country by Hecon Corporation of Eatontown, New Jersey. Other types of proximity switches are also acceptable including optoelectronic and capacitive switches. Microswitches, reed switches and even mechanical switches having fixed and movable portions may also be used. In fact, any switch triggered by the appropriate movement of the jig 10 could at least be theoretically acceptable, although certain type of mechanical switches may wear out too quickly for efficient use.

Also, since the drilling jigs are under computer control, it may be possible to more precisely synchronize the drilling operation with the dispensing of the solution by connecting the switch 28 to an extra clock or timer line located in this computer. Thus, it would no longer be necessary to switch on the spray based upon the physical proximity between the drilling jig 10 and the printed circuit board 18 as such proximity only indicates that the drilling operation is soon to begin. Rather, the timing line would turn on the spray and the vacuum at the moment the drilling operation commenced.

The particular form of the switch and/or timing mechanism is unimportant for the purposes of the invention, it being necessary only that the fluid coating the drill bit be dispensed as the operating drill bit engages the surface of the printed circuit board so that the fluid flows down into the hole being created and prevents the smear from forming. Thus, the fluid is dispensed only during the drilling operation and is turned off when the drills are turned off or when they are removed from the vicinity of the printed circuit boards.

A solution comprising 9% active amines, 10% fatty acids, a surface tension reducing agent and water is applied to a drill bit as a spray as the bit engages a multilayer circuit board. Monoethanolamine is the preferred active amine, oleic acid may be used as one of the fatty acid components, and amyl alcohol works well as a surface tension reducing agent. High and low pressure lubricants and stabilizers may also be included.

The solution, although containing active amines, is neutralized by the fatty acids except in the presence of heat. Heat, however, is generated by the drill bit as it makes contact with the printed circuit board. When this occurs the monoethanolamine becomes very active and overcomes the neutralizing effect of the acid. Thus, in the region of the hole thus being formed, the monoethanolamine attacks the glass epoxy as the hole is being drilled and prevents smear from forming.

The preferred method of applying the solution is to spray it on the drill bit or in the vicinity of the hole to be drilled so that the solution coats the bit as it engages the board. It will occur to one of ordinary skill in the art that other methods could be employed for applying the solution to the areas being drilled simultaneously with the drilling operation. What is important, however, is that the solution be applied in such a manner that it enters the hole being formed by the drill. When this occurs the heat of the drill bit will activate the monoethanolamine which will allow it to prevent smear from forming. Another useful side effect of the solution is that is cleans the hole as it is drilled, removing burrs, particles and other matter that often remains in the hole after the drilling operation. The solution lowers the coefficient of friction at the interface of the drill to copper thus enabling the drill to pass through the boards with improved accuracy. This helps to obviate the need for a series of post drilling treatment steps.

The solution primarily comprises monoethanolamine, oleic acid, amyl alcohol and water. The oleic acid is a fatty acid which keeps the monoethanolamine neutral except in the presence of high heat, where it becomes very active. Other fatty acids, however, may have the same effect and it is not necessary that oleic acid be used exclusively. The amyl alcohol is an agent which reduces the surface tension of the solution thus permitting it to enter the relatively small holes formed by a drill bit. Other alcohols, however, will also perform this function. The monoethanolamine works best with printed circuit boards comprising layers of copper sandwiching glass epoxy layers. Other active amines, however, may work better with other printed circuit board materials. The proportions may also be varied to fit the particular circumstances of the drilling operation and other ingredients having special functions may be added. In particular, the amount of alcohol is dictated by the overall viscosity of the solution; the more viscous the solution, the more alcohol is needed. The relative proportions of the active amine and the fatty acid are dictated in part by the materials of the printed circuit board and also in part by the amount of heat generated by the drill bit.

An example of a preferred formula for the solution of the invention is shown below in Table 1.

TABLE 1

| Emery 880 | 5.0% V/V |
|---|---|
| Emery 621 | 5.0% V/V |
| Monoethanolamine | 8.0% V/V |
| GAF LP 700 | 2.0% V/V |
| Diethylamine | 1.0% V/V |
| Nitrilotriacetic acid (NTA) | 0.5% W/V |
| Primary amyl alcohol | .1% V/V |
| Deionized water | balance |

Some of the ingredients listed above are proprietary chemicals. The Emery 880 and Emery 621 are available from Emery Chemical Corporation of Cincinatti, Ohio. Emery 880 which functions like oleic acid is a blend of octanoic and decanoic acids together with oleic acid and minor amounts of other fatty acids. Emery 621, which functions like the Emery 880 and in addition is a low pressure lubricant and surface tension reducer, is a natural product coconut fatty acid whose primary ingredient is lauric acid. GAF LP 700, which provides high pressure lubricity and helps to prevent delamination is a product of GAF Corporation of Wayne, N.J., and is essentially an organo phosphate. The NTA provides hard water stability where the water has a high mineral content. This helps to prevent tarnish and is also an anti-foaming agent. EDTA may be used as a substituted for NTA.

When the solution described above is dispensed by spraying it on the drill bit during drilling, the shearing ability of the drill bit is increased due to the lubricity provided by the solution. The solution is able to penetrate the holes formed by the drill because of agents such as amyl alcohol and lauric acid which reduce surface tension. Another property of the solution is that it deposits an anti-tarnish layer which prevents oxidation and allows for quicker initiation of the electroless copper deposit which is used to plate the interior of the holes. In addition, the solution has a high specific heat that quickly cools the drill which also helps to prevent smear from forming. Another advantage of using the solution is the reduction of wear to both the primary cutting face and the margin cutting edge of the drill. This is caused by the lubricating effect of the solution, and the resulting reduction in wear and increased efficiency of the cutting edges are clearly evidenced by the wear pattern on drills after thousands of strokes.

There are a number of benefits of this process to the user which are not possible with prior art desmearing lines or other processes. First, throughput and production are increased because larger stack heights for the same size tools are possible. A higher feed rate, a higher drilling speed and higher chip loads are also possible. Drills last longer and longer flute lengths are permitted by the lubricity of the liquid without losing the registration of the holes of the bottom panel. Also less carbide stock is removed during a repoint operation. This means that the drills may be repointed more times before minimal flute length is reached. Waste treatment of the solution is not difficult since the solution completely dissipates in water, and does not contain any heavy metals or strong oxidizing agents or acids.

Use of the solution provides certain other benefits to the printed circuit boards and to the drill bits used on them. For example, there is less deformation of the inner layers of multilayered printed circuit boards. Also, delamination or "pink ring" is decreased, and the quality of the hole is better because of a decrease in the amount of loose fibers left in the hole.

A test using the solution of Table 1 was conducted to determine its effect upon printed circuit boards and the drill bit during drilling. In this study both hole quality and relative amounts of drill bit wear were compared between samples using the solution and control samples drilled completely "dry." The drilling was performed on multilayer FR4 circuit board material without an entry foil. Each drill was run for 1200 hits, although complete penetration of the circuit boards on the control samples was achieved in only 500 instances. The drilling parameters were as follows:

| Drill Size: | .016 inch diameter |
|---|---|
| Speed: | 80,000 rpm |
| Feed Rate: | 80 inches per minute |
| Chip Load: | .0010 inches per REV |

The solution was dispensed so that it coated the drill bit during drilling for the test group. As mentioned previously, the control group was drilled "dry." A scanning electron-microscope was used to evaluate the relative amounts of drill bit wear. The drill bit runs with the solution showed markedly better "stay-sharp" ability especially considering that the drills in the control runs did not completely penetrate most of the holes.

The circuit board samples were initially plated with electroless copper immediately after drilling with no cleaning or etching. They then received a copper strike and electrolytic copper plating to preserve the holes in the as-drilled condition as much as possible. Sections representing the start, middle and end of the drill runs were then removed and prepared for metallographic examination.

The results of the hole quality study indicated that the circuit boards drilled dry showed generally rougher hole walls. The top sides of these boards showed an enlarged hole diameter indicating a greater degree of drill tip wandering and high compressive stress. There was a much greater degree of burring and deformation of the surface clad and inner layers. This would suggest that drilling dry imparts greater axial loads and frictional forces to the drill bit than when the solution is used. Intermittant evidence of smear was also detected in the dry samples.

The holes drilled with the solution appeared relatively smooth sided and seemed to have less disturbance in the vicinity of the glass fibers. Little or no burring was generated on either side of the board and no resin smear was detected in any hole that was examined. There was virtually no degradation of hole quality from the start to the end of the run 1200 hits later.

The solution enabled the drill bit to remain sharp significantly longer. After 1200 hits it was still producing good quality holes that were free of resin smear, burring and excessive deformation of the circuit board material.

While the test results described above were obtained using the solution of Table 1, other formulations for the solution may be preferable depending upon the precise type of circuit board material to be used. In particular, the following table, Table 2, shows the acceptable ranges for constituent components of the solution.

TABLE 2

| | |
|---|---|
| 2–10% V/V | Emery 880 or oleic acid |
| 2–10% V/V | Coconut fatty acid or Emery 621 |
| 4–15% V/V | Monoethanolamine |
| 1–7% V/V | GAF LP-700 or an organo phosphate |
| 0.5–4% V/V | Diethylamine |
| 0.1–1% W/V | NTA or EDTA |
| .1–.2% V/V | Amyl Alcohol |
| Balance is deionized water | |

The terms and expressions which have been employed in the foregoing abstract and specification are used therein as terms of description and not of limitation, and there is no intention in the use of such terms and expressions of excluding equivalents of the features shown and described or portions thereof, it being recognized that the scope of the invention is defined and limited by the claims which follow.

What is claimed is:

1. A method of preventing smear in the manufacture of multi-layer printed circuit boards comprising the steps of:
   (a) placing a multi-layer printed circuit board in a drilling jig;
   (b) bringing a drill into proximity with the multi-layer printed circuit board;
   (c) sensing the proximity of the drill to the multi-layer printed circuit board; and
   (d) at a predetermined proximity of the drill to the circuit board, dispensing an aqueous smear preventing solution said solution including at least one active amine, a fatty acid, and a surface tension reducing agent onto the drill as it engages the multi-layer printed circuit board.

2. The method of claim 1, further comprising the step of halting the dispensing of the solution when the drill bit is withdrawn from the proximity of the printed circuit board.

3. The method of claim 1, further comprising the step of directing a low pressure condition adjacent said drill bit during the performance of step (d) to withdraw the excess of said solution from the vicinity of said printed circuit board.

4. The method of claim 1 wherein the smear preventing solution is dispensed in the form of a spray.

5. The method of claim 1 wherein the smear preventing solution is dispensed through a radial bore in a pressure foot member which contact the printed circuit board just prior to the time said printed circuit board is engaged by said rill.

6. The method of claim 5 wherein the smear preventing solution is dispensed at a slight angle to the horizontal plane of the printed circuit board such that the solution flows substantially horizontally across the surface of the printed circuit board as the drill engages the printed circuit board.

7. The method of claim 1 further including the step of creating a source of low pressure in the proximity of said drill while said solution is being dispensed.

8. The delivery system for applying a smear preventing solution to the walls of holes in a printed circuit board as the holes are being drilled comprising:
   (a) A drilling jig including a reciprocally vertically movable drill;
   (b) a housing enclosing the drill and movable in a vertical direction;
   (c) a pressure foot comprising a plastic ring connected to a bottom opening of the housing for contacting the surface of the printed circuit board while drilling takes place, said pressure foot having a radial bore therethrough; and
   (d) a source of smear preventing solution coupled to said radial bore in said ring by a conduit for spraying said solution across the surface of said printed circuit board onto said drill at the point of contact between said drill and said printed circuit board.

9. The delivery system of claim 8 further including a vacuum source coupled to said housing and wherein said pressure foot includes at least one aperture therein to permit air to be drawn into said housing by said vacuum source.

10. The delivery system of claim 9 wherein said conduit is inclined at a slight angle to the horizontal through said radial bore to direct a spray substantially horizontally across said printed circuit board toward said point of contact.

11. The delivery system of claim 2 wherein each aperture in said ring comprises a vertical slot extending from the bottom of the ring.

* * * * *

UNITED STATES PATENT AND TRADEMARK OFFICE
CERTIFICATE OF CORRECTION

PATENT NO.   : 4,917,547

DATED        : April 17, 1990

INVENTOR(S)  : Jeffrey W. Frederickson, et al.

It is certified that error appears in the above-identified patent and that said Letters Patent is hereby corrected as shown below:

Column 1, line 23, change "layer" to --layers--.

Column 3, line 39, change "te" to --the--.

Column 3, line 46, change "boot" to --foot--.

Column 8, line 10, change "contact" to --contacts--.

Column 8, line 12, change "rill" to --drill--.

Column 8, line 22, change "The" to --A--.

Column 8, line 25, change "A" to --a--.

Signed and Sealed this

Third Day of November, 1992

Attest:

DOUGLAS B. COMER

Attesting Officer

Acting Commissioner of Patents and Trademarks